United States Patent
Matsumoto et al.

(10) Patent No.: US 7,034,621 B2
(45) Date of Patent: Apr. 25, 2006

(54) DIVIDER CIRCUIT AND OSCILLATING CIRCUIT INCLUDING THE SAME

(75) Inventors: Shuichi Matsumoto, Chiba (JP); Yoshikazu Yoshida, Hyogo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 155 days.

(21) Appl. No.: 10/341,413

(22) Filed: Jan. 14, 2003

(65) Prior Publication Data

US 2003/0132807 A1   Jul. 17, 2003

Related U.S. Application Data

(60) Provisional application No. 60/348,318, filed on Jan. 16, 2002.

(51) Int. Cl.
*H03L 7/18* (2006.01)
*H03K 23/40* (2006.01)

(52) U.S. Cl. ............... 331/1 A; 331/16; 327/115
(58) Field of Classification Search ............... 331/1 A, 331/16, 18, 25; 327/115, 117, 118, 156–159; 332/127; 360/51; 375/376; 455/260
See application file for complete search history.

(56) References Cited

U.S. PATENT DOCUMENTS

| | | | | |
|---|---|---|---|---|
| 3,673,501 A | * | 6/1972 | Zeph | 377/72 |
| 3,945,387 A | * | 3/1976 | Adams | 607/31 |
| 3,978,413 A | * | 8/1976 | Frohwerk | 377/72 |
| 4,975,654 A | * | 12/1990 | Becker et al. | 329/347 |
| 5,053,647 A | * | 10/1991 | Shizukuishi et al. | 326/40 |
| 6,518,805 B1 | * | 2/2003 | Tam et al. | 327/115 |

FOREIGN PATENT DOCUMENTS

JP   2002-124869   *  4/2002

* cited by examiner

*Primary Examiner*—David Mis
(74) *Attorney, Agent, or Firm*—Volentine Francos & Whitt, PLLC (57) ABSTRACT

A divider circuit including a plurality of latch circuits which are connected in series such that each of the latch circuits is responsive to a control signal to latch data which is output from a preceding latch circuit in the series, and a logic circuit which receives the data output from the plurality of latch circuits and which outputs a logic operation result to a first latch circuit in the series of the plurality of latch circuits.

6 Claims, 8 Drawing Sheets

DIVIDER CIRCUIT AND OSCILLATING CIRCUIT INCLUDING THE SAME

BACKGROUND OF THE INVENTION

1. Field of the Invention

The present invention relates, in general, to a wireless data receiving device and, more particularly, to a divider circuit. This claims priority under 35 USC §119(e) (1) of Provisional Application No. 60/348,318, filed on Jan. 16, 2002.

2. Description of the Related Art

Figure 5:
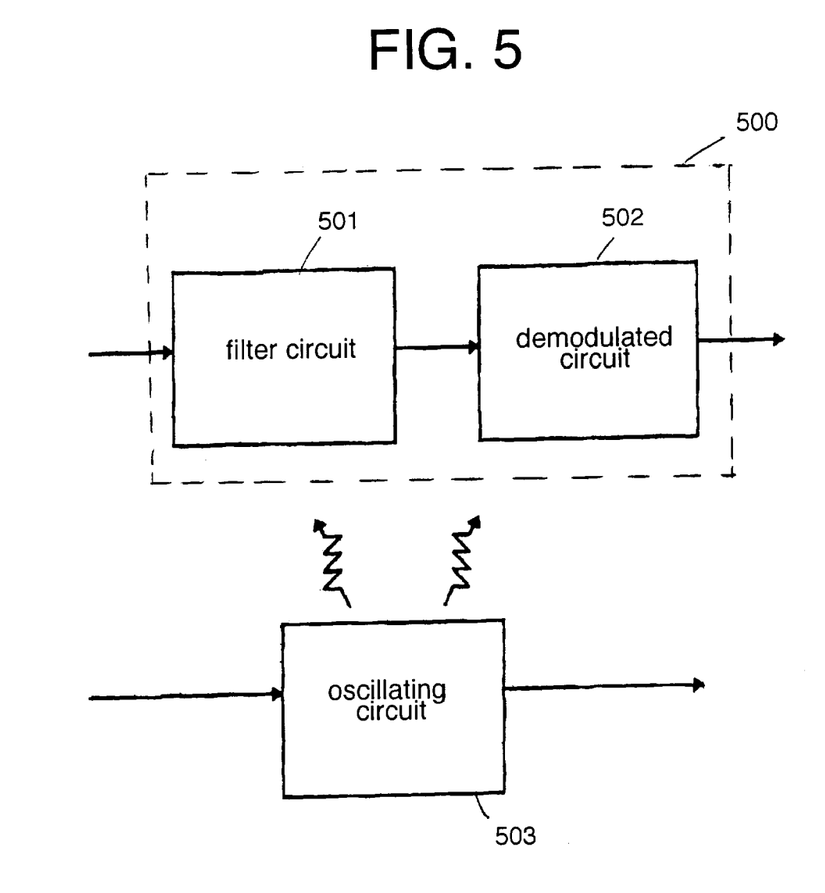
FIG. 5 is a block diagram showing a wireless data receiving device having an oscillating circuit.
Figure 6:
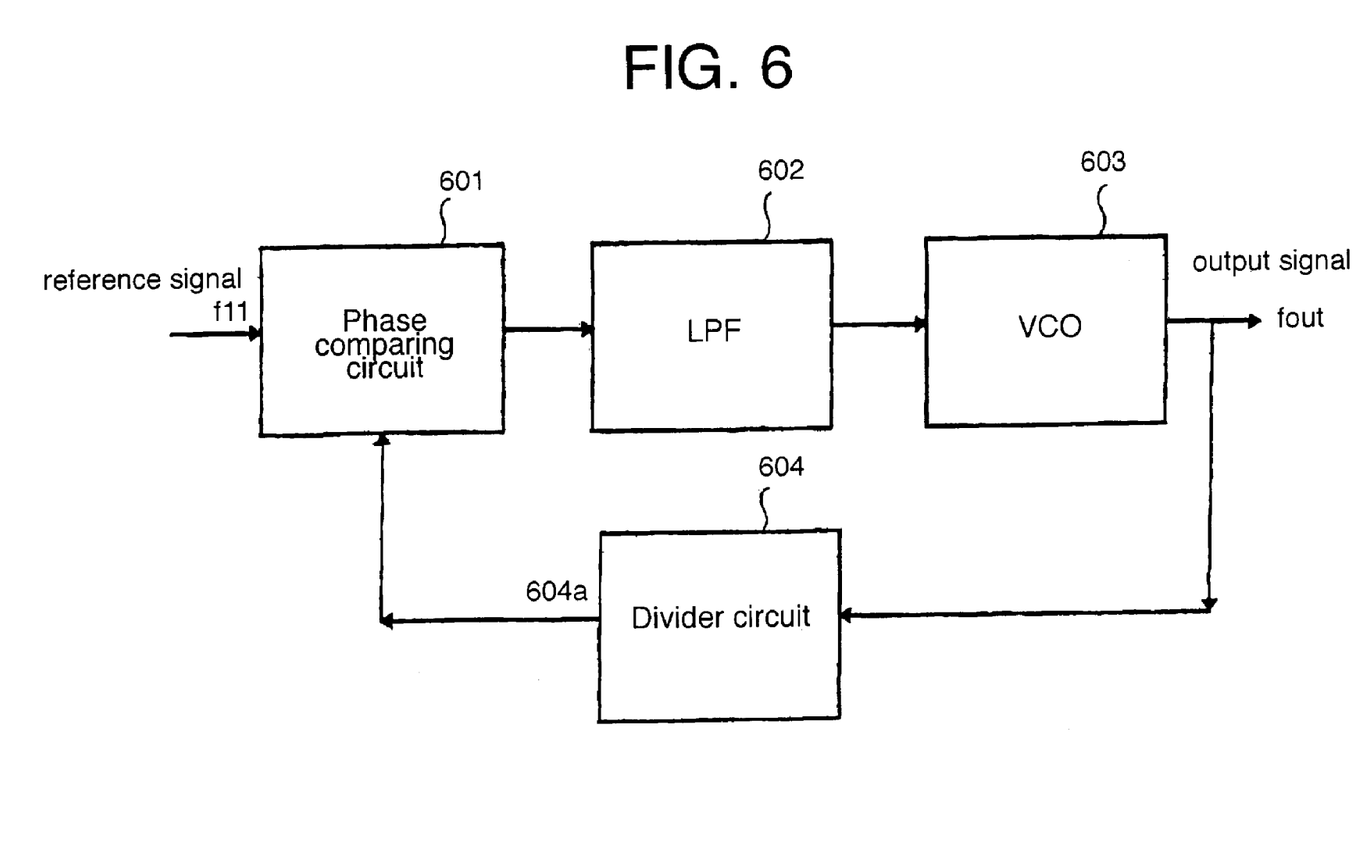
FIG. 6 is a block diagram of the oscillating circuit having a divider circuit.
Figure 7:
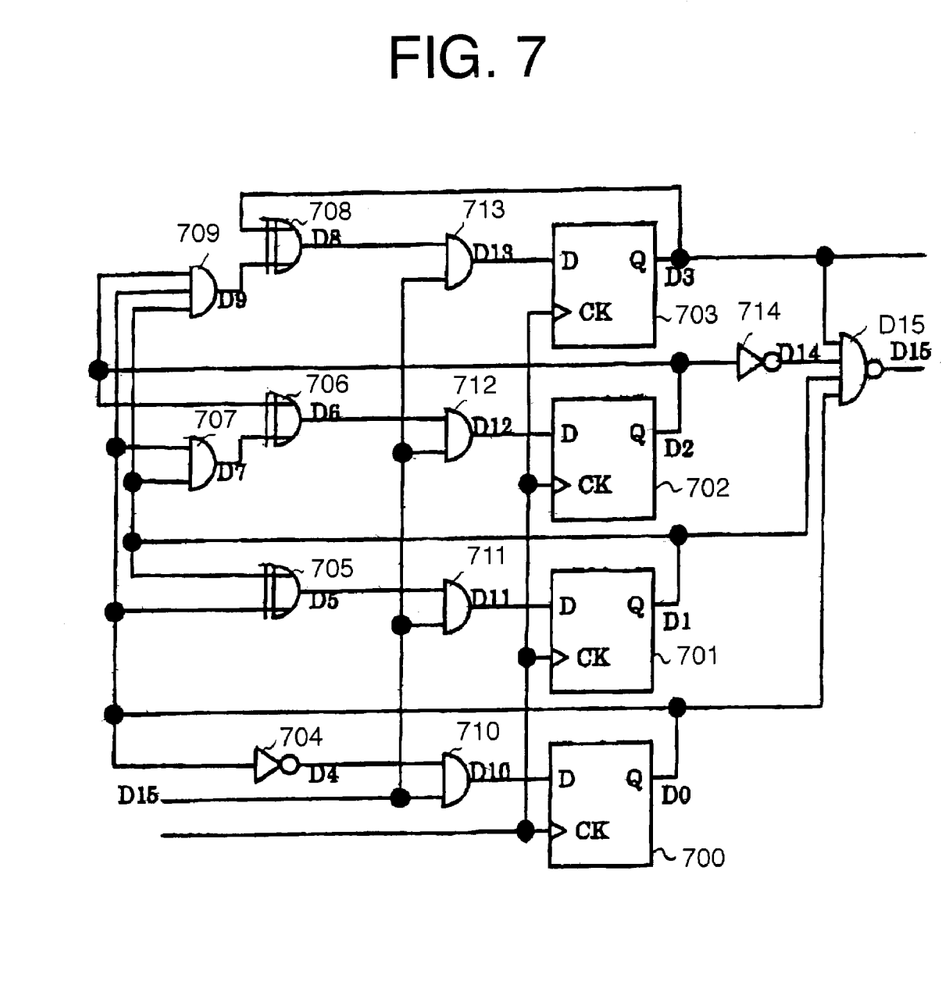
FIG. 7 is a block diagram of a conventional divider circuit.

FIG. 5 is a block diagram showing a wireless data receiving device. Referring to FIG. 5, the wireless data receiving device comprises a filter/demod circuit 500 and an oscillating circuit 503. The filter/demod circuit 500 comprises a filter circuit 501 and a demodulated circuit 502. FIG. 6 is block diagram showing the oscillating circuit. Referring to FIG. 6, the oscillating circuit 503 comprises a phase comparing circuit 601, a low-pass filter (LPF) 602, a voltage-controlled oscillator (VCO) 603 and a divider circuit 604. FIG. 7 is a block diagram showing a conventional divider circuit using a binary counter. Referring to FIG. 7, the conventional divider circuit comprises D-type flip-flops (DFF) 700–703, inverter circuits 704 and 714, exclusive OR (XOR) circuits 705, 706 and 708, AND circuits 707 and 709–713 and a NAND circuit D15. The conventional divider circuit is a 12th divider circuit. The conventional divider circuit has a four-bit counter and is a reset counter. The counter becomes zero after eleven (decimal number). D-type flip-flops 700–703 hold each bit value of the four-bit counter. Each of output signals D0–D3 output from D-type flip-flops 700–703 are the 2nd, 4th, 8th and 12th dividing signals, respectively. The signal D3 is used in the phase comparing circuit 601, but the other signals D0–D2 and D4–D15 are only used to generate the signal D3 in the conventional divider circuit. Except for the signal D3, every signal used in the conventional divider circuit might radiate from the conventional divider circuit and may become a noise signal in peripheral circuits.

Figure 8:
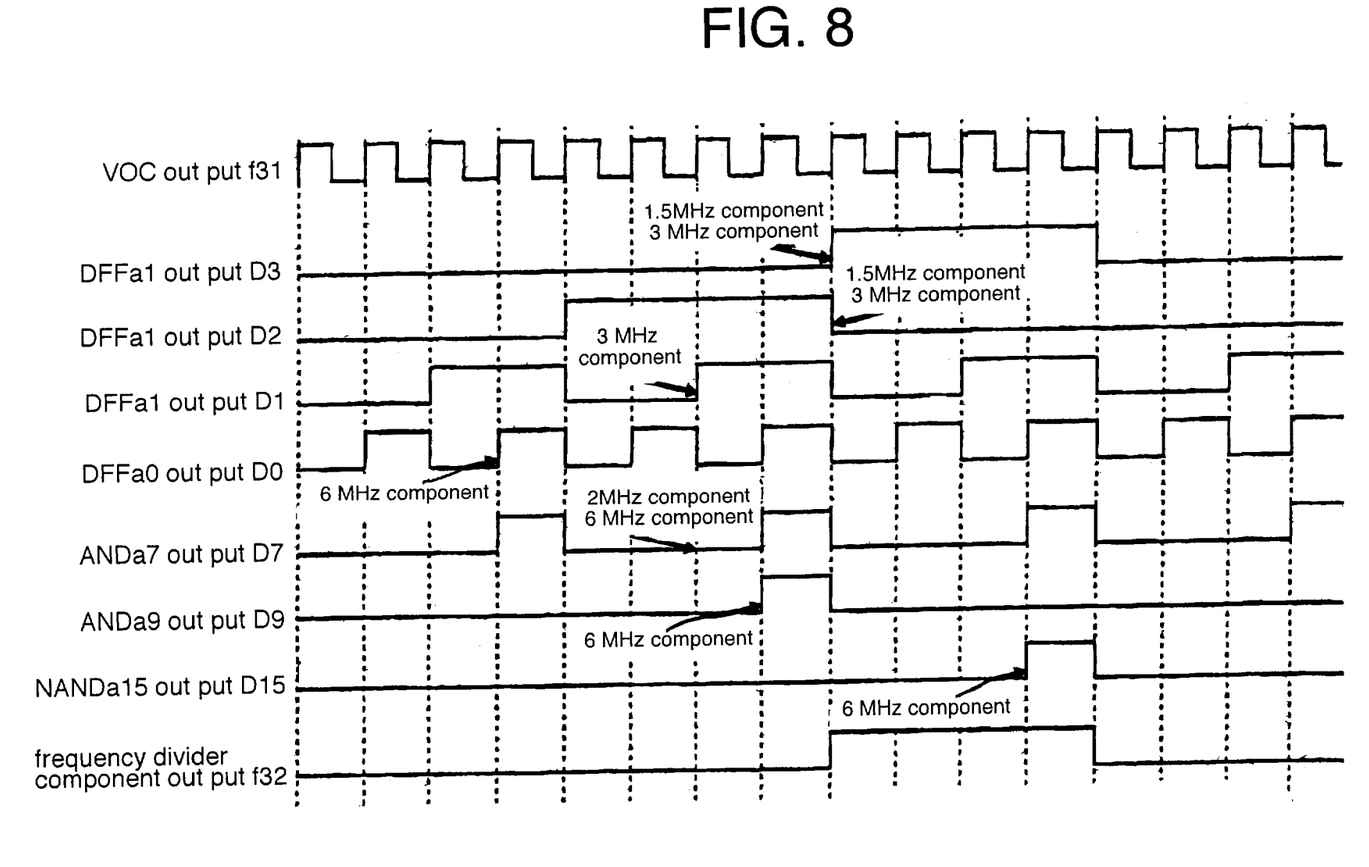
FIG. 8 is a timing chart for explaining the operation of FIG. 7.

Next, that signals in the conventional divider circuit become noise will be described with reference to the following example. FIG. 8 is a timing chart for explaining the operation of FIG. 7. In this example, the filter circuit 501 only passes the signal which has frequency components from 1.5 MHz (megahertz) to 2.5 MHz and cuts off the signal which has frequency components outside of the range. Also, in this example, the conventional divider circuit has input thereto the signal having frequency components of 12 MHz. The signal D0 having a frequency component of 6 MHz, the signal D1 having a frequency component of 3 MHz, the signal D2 having a frequency component of 3 MHz, the signal D3 having a frequency component of 3 MHz, the signal D7 having a frequency component of 6 MHz and the signal D9 having a frequency component of 6 MHz are outside of the passing band of the filter circuit 501. The filter circuit 501 cuts off these signals. Therefore, these signals do not become noise signals having a bad effect on system. On the other hand, the signal D2 having a frequency component of 1.5 MHz, the signal D3 having a frequency component of 1.5 MHz and the signal D7 having a frequency component of 2 MHz are inside of the passing band of the filter circuit 501. So, when these signals are input to the filter circuit 501, the filter circuit 501 passes these signals to later circuits. Therefore, these signals become noise signals. So, the passed noise signals have a bad effect on system.

SUMMARY OF THE INVENTION

According to one aspect of the present invention, there is provided a divider circuit including a plurality of latch circuits which are connected in series such that each of the latch circuits is responsive to a control signal to latch data which is output from a preceding latch circuit in the series and a logic circuit which receives the data output from plurality of latch circuits and which outputs a logic operation result to a first latch circuit in the series of the plurality of latch circuits.

DETAILED DESCRIPTION OF THE PREFERRED EMBODIMENTS

A divider circuit according to the preferred embodiments of the present invention will be described. The divider circuit according to the present invention is used in an oscillating circuit 503 of a wireless data receiving device shown in FIG. 5. The wireless data receiving device according to the present invention comprises a filter/demod circuit 500 and the oscillating circuit 503. The filter/demod circuit 500 comprises a filter circuit 501 and a demodulated circuit 502. The filter circuit 501 has input thereto a modulated input signal, and extracts desired channel signal components and outputs the desired channel signal components as a channel signal. The demodulated circuit 502 has input thereto the channel signal, and demodulates the channel signal and outputs a demodulated data. The oscillating circuit 503 has input thereto a reference signal, for example a clock reproducing signal, and generates a clock signal which is synchronized with the reference signal and which is high frequency wave in comparison with the reference signal. Referring to FIG. 6, the oscillating circuit 503 is a phase-locked loop (PLL) circuit which comprises a phase comparing circuit 601, a low pass filter (LPF) 602, a voltage-controlled oscillator (VCO) 603 and a divider circuit 604. The phase comparing circuit 601 compares the reference signal with a divided signal 604a and outputs a pulse signal according to phase differences between the reference signal and the divided signal. The LPF 602 has input thereto the pulse signal, and integrates the pulse signal (smoothing) and transfers the integrated signal into D.C. voltage. The VCO 603 generates an output signal which has frequency Nth times as high as the reference signal (N is an integer). The divider circuit 604 divides the frequency of the output signal as 1/N (Nth dividing), and outputs the result as the divided signal 604a.

Moreover, not all the combinations of the characteristics of the present invention described in the embodiments are essential to the present invention.

A divider circuit according to a first preferred embodiment of the present invention will be described with reference to FIGS. 1–2.

First, the composition of the divider circuit according to the first preferred embodiment of the present invention will be described. FIG. 1 is a block diagram showing the divider circuit according to the first preferred embodiment of the present invention.

Figure 1:
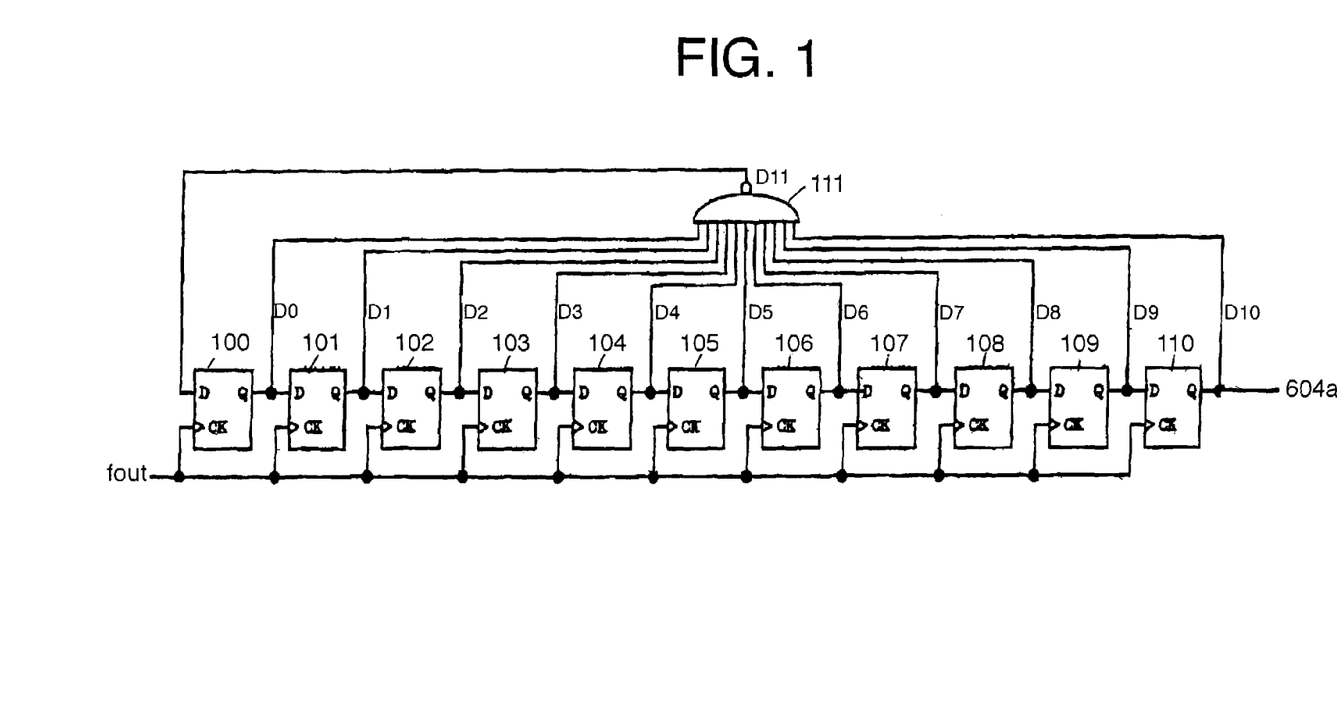
FIG. 1 is a block diagram showing a divider circuit according to a first preferred embodiment of the present invention.

As shown in FIG. 1, the divider circuit has D-type flip-flops (DFF) 100–110 and a NAND circuit 111. Each DFF has a data input terminal D, a clock input terminal CK and a output terminal Q. NAND circuit 111 has input terminals to the number of 11 and one output terminal.

DFFs 100–110 to the number of 11 are connected with the each other in series. The output terminals Q of DFFs 100–109 are connected with the data input terminals D of DFFs 101–110. All of the output terminals Q of DFFs 100–110 are connected with input terminals of NAND circuit 111. The output terminal Q of the last DFF 110 is connected with the phase comparing circuit 601 shown in FIG. 6. Each of the input terminals CK of DFFs 100–110 are coupled to the output signal fout shown in FIG. 6. The output terminal of NAND circuit 111 is connected with the data input terminal D of DFF 100. The output signals D0–D10 which are output from DFFs 100–110 have the same wave form except for phase. Every one of output signals D0–D10 can become the divided signal 604a.

Though the output signal D10 which is output from the last DFF 110 is not supplied to the data input terminal D of DFF 100, DFFs 100–110 comprise a ring counter which does not need preset operation. Therefore, the divider circuit according to the first preferred embodiment of the present invention uses the ring counter.

Next, the operation of the divider circuit according to the first preferred embodiment of the present invention will be described with reference to both FIG. 1 and FIG. 2. FIG. 2 is a timing chart for explaining the operation of FIG. 1.

DFFs 101–110 latch the output signals which are output from DFFs 100–109 according to the rising edge of the output signal fout. In addition, the first DFF 100 latches the output signal which is output from NAND circuit 111 according to the rising edge of the output signal fout. The output signal 604a which is output from the last DFF 110 is supplied to the phase comparing circuit 601 as the divided signal 604a. In an initial condition, even though DFFs 100–110 randomly output "0" or "1" as the output signals D0–D10, NAND circuit 111 keeps the voltage level of its output signal at a high voltage level "H". After the output signal fout is provided at the clock input terminals for a while, the voltage level of all output signals D0–D10 become high voltage level "H" and the voltage level of the output signal which is output from NAND circuit 111 becomes low voltage level "L". After that, the divider circuit operates. In concrete terms, DFF 100 outputs the output signal D0 having low voltage level "L" according to the rising edge of the output signal fout. At this time, DFFs 101–110 output the output signals D1–D10 having high voltage level "H". NAND circuit 111 outputs the output signal having high voltage level "H". At the next rising edge of the output signal fout, DFF 101 outputs the output signal D1 having low voltage level "L" and DFFs 100 and 102–110 output the output signals D0 and D2–D10 having high voltage level "H". At this time, NAND circuit 111 outputs the output signal having high voltage level "H". Thereafter, each of DFFs 102–110 output the output signals D2–D10 having low voltage level "L" in turn, according to the rising edge of the output signal fout. After DFF 110 outputs the output signal D10 having low voltage level "L", when the next rising edge of the output signal fout is input, voltage level of all output signals D0–D10 become high voltage level "H" and NAND circuit 111 outputs the output signal having low voltage level "L".

After that, the same process is repeated according to the rising edge of the output signal fout. The divider circuit according to the first preferred embodiment generates a pulse signal which has duty ratio of 11 to 1. In other words, the divider circuit according to the first preferred embodiment generates a divided signal 604a having low voltage level "L" at every 12 cycles of the output signal fout. Even though the divided signal 604a has duty ratio of 11 to 1, the phase comparing circuit 601 operates without introducing errors. Because the phase comparing circuit 601 compares phases of the reference signal and the divided signal using their rising or falling edges.

Next, whether or not all signals in the divider circuit according to the first preferred embodiment become noise will be described with reference to the following example.

In this example, the filter circuit 501 has center frequency which is 2 MHz and bandwidth which is ±500 KHz (kilohertz). That is, the filter circuit 501 passes a signal which has frequency components from 1.5 MHz to 2.5 MHz. Also, in this example, the divider circuit has input thereto a signal having a frequency of 12 MHz.

Figure 2:
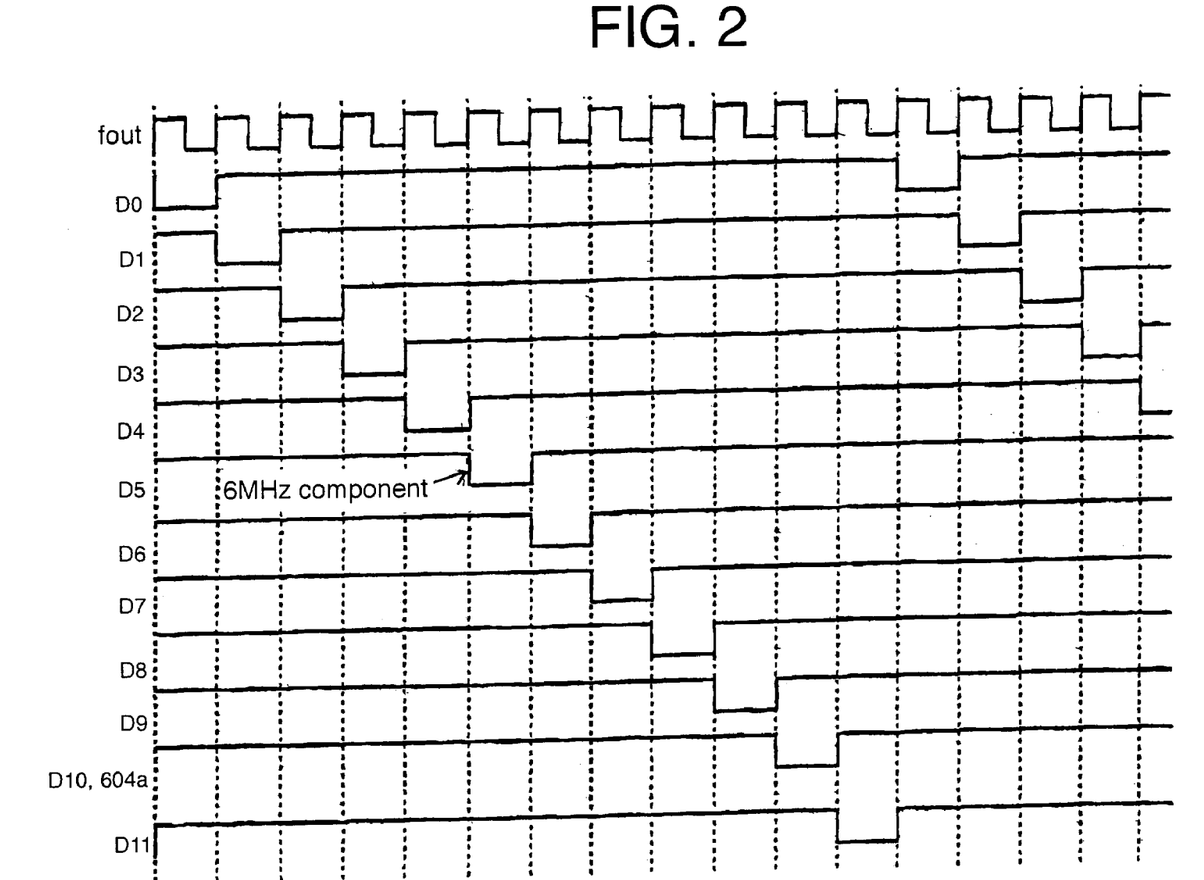
FIG. 2 is a timing chart for explaining of the operation of the divider circuit according to the first preferred embodiment of the present invention.

Referring to both FIG. 1 and FIG. 2, each of DFFs 100–110 and NAND circuit 111 of the divider circuit according to the first preferred embodiment generates a pulse signal (1 MHz) having low voltage level "L" at every 12 cycles of the output signal fout. Further, the output signals D0–D11 output from DFFs 100–110 and NAND circuit 111 have two frequency components of 1 MHz and 6 MHz. That is, each low voltage level period of part of the output signals D0–D11 corresponds to one cycle of the output signal fout. In other words, each of the output signals D0–D11 is a twelfth of the output signal fout, and therefore, each of the output signals D0–D11 has the frequency component of 1 MHz. Furthermore, each remaining part of the output signals D0–D11 has a low voltage level period of part of the output signals D0–D11 corresponding to one cycle of the output signal fout. In other words, each of the output signals D0–D11 divides the frequency of the output signal fout in half, and therefore, each of the output signals D0–D11 has the frequency component of 6 MHz. Now, the filter circuit 501 passes a signal which has frequency components from 1.5 MHz to 2.5 MHz. Even if the noise having the frequency component of 6 MHz is input the filter circuit 501, the filter circuit 501 cuts off the noise. So, the noise does not have a bad effect on system.

The divider circuit according to the first preferred embodiment of the present invention uses a ring counter. Since the wave form of the output signal 604a is the same as that of the output signals D0–D11, frequency components of the output signals D0–D11 except for the output signal 604a which is necessary as the output signal of the divider circuit are outside the passing band of the filter circuit 501. Therefore, the divider circuit according to the first preferred embodiment of the present invention prevents occurring noises which have a bad effect on system.

In addition, since the divider circuit according to the first preferred embodiment of the present invention prevents occurring noises which have a bad effect on system, system reliability of the wireless data-receiving equipment having the divider circuit increases.

A divider circuit according to a second preferred embodiment of the present invention will be described with reference to FIGS. 3–4.

First, the composition of the divider circuit according to the second preferred embodiment of the present invention will be described. FIG. 3 is a block diagram showing the divider circuit according to the second preferred embodiment of the present invention. Like elements are given like or corresponding reference numerals in the first and second preferred embodiments. Thus, dual explanations of the same elements are avoided.

Figure 3:
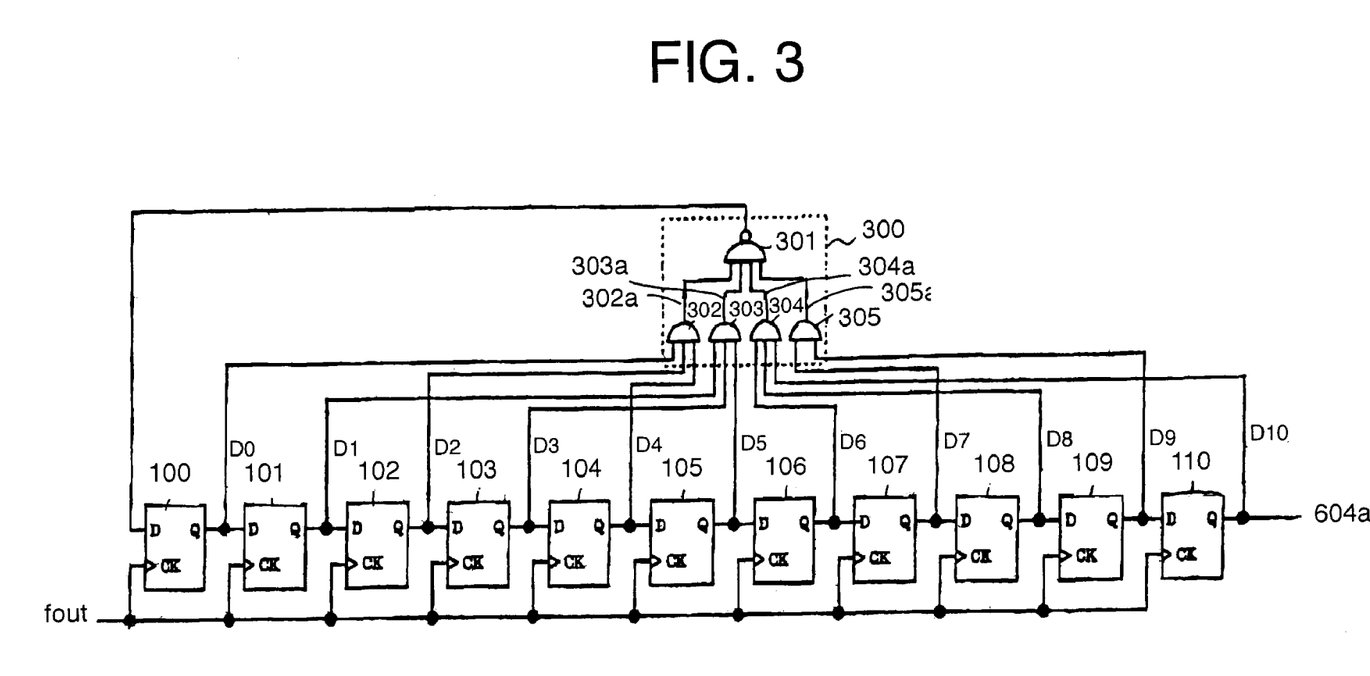
FIG. 3 is a block diagram showing a divider circuit according to a second preferred embodiment of the present invention.

As shown in FIG. 3, the divider circuit has DFFs 100–110 and a NAND circuit 300. NAND circuit 300 has input terminals to the number of 11 and one output terminal. The output terminal of NAND circuit 300 is connected with the data input terminal D of DFF 100. NAND circuit 300 has a NAND circuit 301 and AND circuits 302–305. NAND circuit 301 has input terminals to the number of 4 and one output terminal. AND circuits 302–304 have input terminals to the number of 3 and one output terminal. AND circuit 305 has input terminals to the number of 2 and one output terminal. AND circuit 302 is connected with the output terminals Q of DFFs 100, 102 and 104 and has input thereto the output signals D0, D2 and D4. AND circuit 303 is connected with the output terminals Q of DFFs 101, 103 and 105 and has input thereto the output signals D1, D3 and D5. AND circuit 304 is connected with the output terminals Q of DFFs 106, 108 and 110 and has input thereto the output signals D6, D8 and D10. AND circuit 305 is connected with the output terminals Q of DFFs 107 and 109 and has input thereto the output signals D7 and D9. The output terminals of AND circuits 302–305 are connected with the input terminals of NAND circuit 301. The output terminal of NAND circuit 301 is connected with the data input terminal D of DFF 100.

Next, the operation of the divider circuit according to the second preferred embodiment of the present invention will be described with reference to both FIG. 3 and FIG. 4. FIG. 4 is a timing chart for explaining the operation of FIG. 3.

When the output signals D0, D2 and D4 have high voltage level, AND circuit 302 outputs a pulse signal 302a having high voltage level. When the output signals D1, D3 and D5 have high voltage level, AND circuit 303 outputs a pulse signal 303a having high voltage level. When the output signals D6, D8 and D10 have high voltage level, AND circuit 304 outputs a pulse signal 304a having high voltage level. When the output signals D7 and D9 have high voltage level, AND circuit 305 outputs a pulse signal 305a having high voltage level. When the pulse signals 302a–305a have high voltage level, NAND circuit 301 outputs the output signal D11 having low voltage level. In other words, when all the output signals D0–D10 have high voltage level, NAND circuit 300 outputs the output signal D11 having low voltage level.

Next, whether or not all signals in the divider circuit according to the second preferred embodiment become noise will be described with reference to the following example.

In this example, the filter circuit 501 has center frequency which is 2 MHz and bandwidth which is ±500 KHz. That is, the filter circuit 501 passes signal which has frequency components from 1.5 MHz to 2.5 MHz. Also, in this example, the divider circuit has input thereto a signal having a frequency of 12 MHz.

Figure 4:
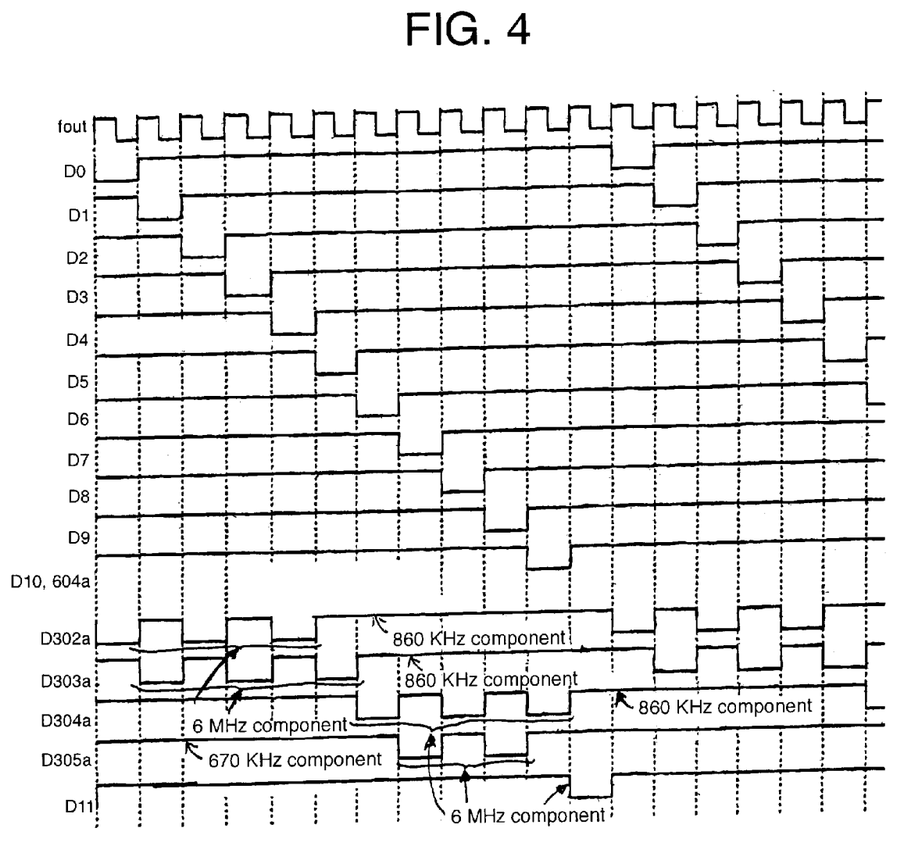
FIG. 4 is a timing chart for explaining of the operation of the divider circuit according to the second preferred embodiment of the present invention.

Referring to both FIG. 3 and FIG. 4, each of DFFs 100–110 and NAND circuit 300 of the divider circuit according to the second preferred embodiment generates a pulse signal (1 MHz) having low voltage level "L" at every 12 cycles of the output signal fout. Further, the pulse signals 302a–304a output from the AND circuits 302–304 have two frequency components of 6 MHz and 860 kHz (kilohertz). That is, each low voltage level period of part of the pulse signals 302a–304a corresponds to one cycle of the output signal fout. In other words, each of the pulse signals 302a–304a divides the frequency of the output signal fout in half, and therefore, each of the pulse signals 302a–304a has the frequency component of 6 MHz. Furthermore, each remaining part of the pulse signals 302a–304a has seven consecutive periods at a high voltage level. Under the assumption that one cycle would be constituted by seven periods of high voltage level and seven periods of low voltage level, the signal frequency is 12 MHz divided by 14 periods which equals 0.857 MHz. As such, each of the pulse signals 302a–304a has the frequency component of 860 kHz. By the way, a period of low voltage level of the pulse signal 305a corresponds to one cycle of the output signal fout. In other words, the pulse signal 305a divides frequency of the output signal fout in half. Therefore, the pulse signal 305a has frequency component of 6 MHz. Furthermore, the pulse signal 305a has nine high voltage levels. It assumes that one cycle of this wave has nine high voltage levels and nine low voltage levels. 12 MHz divided by 18 equals 0.666 MHz. Therefore, the pulse signal 305a has frequency component 670 KHz. Now, the filter circuit 501 passes signal which has frequency components from 1.5 MHz to 2.5 MHz. Even if the noise having the frequency components of 670 KHz, 860 KHz and 6 MHz are input the filter circuit 501, the filter circuit 501 cuts off the noise. So, the noises do not have a bad effect on system.

A combination of NAND circuit 301 and AND circuits 302–305 is not limited in FIG. 3. The combination is flexibly changed according to used frequency on system or system specification.

As the divider circuit according to the first preferred embodiment, the divider circuit according to the second preferred embodiment of the present invention uses a ring counter. Since the wave form of the output signal 604a is the same as that of the output signals D0–D11, frequency components of the output signals D0–D11 except for the output signal 604a which is necessary as the output signal of the divider circuit are outside of the passing band. Therefore, the divider circuit according to the second preferred embodiment of the present invention prevents occurring noises which have a bad effect on system.

In addition, as the divider circuit according to the first preferred embodiment, since the divider circuit according to the second preferred embodiment of the present invention prevents occurring noises which have a bad effect on system, system reliability of the wireless data receiving equipment having the divider circuit increases.

In addition, it is not easy that a logic element having lots of input terminals is formed on the substrate. The NAND circuit of the divider circuit according to the second preferred embodiment of the present invention comprises a four input and one output NAND circuit. Therefore, NAND circuit of the second preferred embodiment is easily formed on the substrate.

While the preferred form of the present invention has been described, it is to be understood that modifications will be apparent to those skilled in the art without departing from the spirit of the invention. For example, the divider ciruit has a NAND circuit. However, the NAND circuit may be omitted and the output terminal Q of the last DFF may be connected with the data input terminal D of the first DFF.

The scope of the invention, therefore, is to be determined solely by the following claims.

What is claimed:

1. An oscillating circuit comprising:
   a phase comparing circuit which receives a reference signal and a divided signal, and which outputs a pulse signal according to a phase difference between the reference signal and the divided signal;
   a low pass filter circuit having a frequency passing band, which receives the pulse signal and which outputs an output signal having a first frequency that is within the frequency passing band;
   a voltage-controlled oscillator which receives the output signal and which outputs an oscillator output signal; and
   a divider circuit, wherein said divider circuit comprises
      a plurality of latch circuits which are connected in series such that each of the latch circuits is responsive to said oscillator output signal to latch a data signal which is output from a preceding latch circuit in the series, so that each of the data signals output from the latch circuits has a second frequency that is not in the frequency passing band, and
      a logic circuit which receives the data signals output from the plurality of latch circuits and which outputs a logic operation signal having the second frequency to a first latch circuit in the series of the plurality of latch circuits, so that the divider circuit only generates signals having the second frequency.

2. The oscillating circuit according to claim 1, wherein said latch circuits are D-type flip-flops.

3. The oscillating circuit according to claim 1, wherein said logic circuit is a NAND logic circuit.

4. The oscillating circuit according to claim 3, wherein said plurality of latch circuits are divided into groups, wherein the logic operation signal is a first logic operation signal, and wherein said NAND logic circuit comprises:
   a plurality of AND circuits, wherein each of the AND circuits receives the data signal output from one of the groups and outputs a second logic operation signal; and
   a NAND circuit which receives the second logic operation signals output from the plurality of AND circuits and outputs the first logic operation signal.

5. The oscillating circuit according to claim 4, wherein said latch circuits are D-type flip-flops.

6. The oscillating circuit according to claim 2, wherein said logic circuit is a NAND circuit.

* * * * *